US011957063B2

United States Patent
Guo et al.

(10) Patent No.: US 11,957,063 B2
(45) Date of Patent: Apr. 9, 2024

(54) MAGNETORESISTIVE ELEMENT HAVING A NANO-CURRENT-CHANNEL STRUCTURE

(71) Applicants: Yimin Guo, San Jose, CA (US); Rongfu Xiao, Dublin, CA (US); Jun Chen, Fremont, CA (US)

(72) Inventors: Yimin Guo, San Jose, CA (US); Rongfu Xiao, Dublin, CA (US); Jun Chen, Fremont, CA (US)

( * ) Notice: Subject to any disclaimer, the term of this patent is extended or adjusted under 35 U.S.C. 154(b) by 277 days.

(21) Appl. No.: 17/460,189

(22) Filed: Aug. 28, 2021

(65) Prior Publication Data

US 2023/0067295 A1    Mar. 2, 2023

(51) Int. Cl.
| | | |
|---|---|---|
| H10N 50/80 | (2023.01) | |
| G11C 11/16 | (2006.01) | |
| H01F 10/32 | (2006.01) | |
| H01F 41/32 | (2006.01) | |
| H10N 50/01 | (2023.01) | |
| H10N 50/85 | (2023.01) | |

(52) U.S. Cl.
CPC .......... *H10N 50/80* (2023.02); *G11C 11/161* (2013.01); *H01F 10/3268* (2013.01); *H01F 10/3286* (2013.01); *H01F 10/329* (2013.01); *H01F 41/32* (2013.01); *H10N 50/01* (2023.02); *G11C 11/1675* (2013.01); *H01F 10/3259* (2013.01); *H10N 50/85* (2023.02)

(58) Field of Classification Search
None
See application file for complete search history.

(56) References Cited

U.S. PATENT DOCUMENTS

| | | | | |
|---|---|---|---|---|
| 11,659,718 B2* | 5/2023 | Ying | ............... | H10N 50/01 |
| | | | | 365/158 |
| 11,696,511 B2* | 7/2023 | Patel | ............... | H10N 50/10 |
| | | | | 257/421 |
| 11,854,589 B2* | 12/2023 | Guo | ............... | G11C 11/161 |
| 2005/0254287 A1* | 11/2005 | Valet | ............... | H10N 50/10 |
| | | | | 365/158 |
| 2009/0256220 A1* | 10/2009 | Horng | ............... | H10N 50/01 |
| | | | | 257/E29.323 |
| 2010/0315863 A1* | 12/2010 | Zhu | ............... | B82Y 40/00 |
| | | | | 365/158 |
| 2011/0014500 A1* | 1/2011 | Horng | ............... | B82Y 25/00 |
| | | | | 216/13 |
| 2012/0135273 A1* | 5/2012 | Horng | ............... | B82Y 40/00 |
| | | | | 428/828.1 |
| 2013/0175644 A1* | 7/2013 | Horng | ............... | B82Y 40/00 |
| | | | | 257/E29.323 |
| 2017/0200767 A1* | 7/2017 | Han | ............... | H10N 50/01 |

* cited by examiner

*Primary Examiner* — Kevin M Bernatz

(57) ABSTRACT

A magnetoresistive element comprises a nonmagnetic nano-current-channel (NCC) structure provided on a surface of the magnetic recording layer, which is opposite to a surface of the magnetic recording layer where the tunnel barrier layer is provided, and comprising a spatial distribution of perpendicular conducting channels throughout the NCC structure thickness and surrounded by an insulating medium, making the magnetic recording layer a magnetically soft-hard composite structure. Correspondingly, the critical write current and write power are reduced with reversal modes of exchange-spring magnets of the magnetically soft-hard composite structure.

19 Claims, 7 Drawing Sheets

MAGNETORESISTIVE ELEMENT HAVING A NANO-CURRENT-CHANNEL STRUCTURE

BACKGROUND OF THE INVENTION

1. Field of the Invention

This invention relates to the field of magnetoresistive elements. More specifically, the invention comprises perpendicular spin-transfer-torque magnetic-random-access memory (MRAM) using magnetoresistive elements as basic memory cells which potentially replace the conventional semiconductor memory used in electronic chips, especially mobile chips for power saving and non-volatility as well as memory blocks in processor-in-memory (PIM).

2. Description of the Related Art

In recent years, magnetic random access memories (hereinafter referred to as MRAMs) using the magnetoresistive effect of ferromagnetic tunnel junctions (also called MTJs) have been drawing increasing attention as the next-generation solid-state nonvolatile memories that can cope with high-speed reading and writing, large capacities, and low-power-consumption operations. A ferromagnetic tunnel junction has a three-layer stack structure formed by stacking a recording layer having a changeable magnetization direction, an insulating spacing layer, and a fixed reference layer that is located on the opposite side from the recording layer and maintains a predetermined magnetization direction.

As a write method to be used in such magnetoresistive elements, there has been suggested a write method (spin torque transfer switching technique) using spin momentum transfers. According to this method, the magnetization direction of a recording layer is reversed by applying a spin-polarized current along a specific direction to the magnetoresistive element. Furthermore, as the volume of the magnetic layer forming the recording layer is smaller, the injected spin-polarized current to write or switch can be also smaller. Accordingly, this method is expected to be a write method that can achieve both device miniaturization and lower currents. However, since the magnetization direction of the recording layer in the planar-type MTJ is in the film plane, a high shape anisotropy or high magneto-crystalline anisotropy material need be used in order to keep a relatively high energy barrier to resist thermal fluctuation. Since the high shape anisotropy requires a high aspect ratio, it is clearly undesirable due to the fact it prevents scalability and high density memory. There is a one technique proposed by J. Wang (see U.S. Pat. No. 7,981,697) that a composite recording layer comprises high magneto-crystalline anisotropy materials in a tri-layered exchange-spring structure: a first magnetic layer/a magnetic nano-current-channel (NCC) layer/a second magnetic layer, and local magnetic moments in the magnetic NCC layer switch the state of the memory element in reversal modes of exchange-spring magnets, which leads to a reduced switching current without scarifying the device thermal stability.

Further, as in a so-called perpendicular MTJ element, both two magnetization films have easy axis of magnetization in a direction perpendicular to the film plane due to their strong perpendicular magnetic anisotropy induced by both interface interaction and crystalline structure (shape anisotropies are not used), and accordingly, the device shape can be made smaller than that of an in-plane magnetization type. Also, variance in the easy axis of magnetization can be made smaller. Accordingly, by using a material having a large perpendicular magnetic anisotropy, both miniaturization and lower currents can be expected to be achieved while a thermal disturbance resistance is maintained or the thermal stability factor, $E_b/k_B T$ ($E_b$ being the energy barrier between the two stable states of an MTJ cell, $k_B$ the Boltzmann constant, and T the absolute temperature), is maintained at a high value.

There has been a known technique for achieving a high MR ratio in a perpendicular MTJ element by forming an underneath MgO tunnel barrier layer and an MgO cap layer that sandwich a magnetic recording layer having a pair of amorphous CoFeB ferromagnetic layers and a Boron-absorbing layer positioned between them, and accelerate crystallization of the amorphous ferromagnetic film to match interfacial grain structure to MgO layers through a thermal annealing process. The magnetic recording layer crystallization starts from both the tunnel barrier layer side and the cap layer side to its center and forms a CoFe grain structure having a perpendicular magnetic anisotropy, as Boron elements migrate into the Boron-absorbing layer. Accordingly, a coherent perpendicular magnetic tunneling junction structure is formed. By using this technique, a high MR ratio can be achieved.

However, when an MTJ CD size is reduced to meet needs of very advanced and small-dimension technology nodes, both the MgO tunnel barrier layer and the MgO cap layer need to be thinner to keep a reasonable MTJ resistance. Note that the resistance property of layered materials is normally described by a resistance-area product (RA), which is product of resistance and area of a film layer. Therefore, it becomes more difficult to achieve both a high perpendicular magnetic anisotropy in a magnetic recording layer and a high MR ratio in an MTJ element in order to maintain a good thermal stability and read/write performance. A thick Boron-absorbing layer may help improve the perpendicular magnetic anisotropy in the recording layer. But, the damping constant of the recording layer may also increase from the thick Boron-absorbing layer material diffusion during the heat treatment in the device manufacturing process.

In a spin-injection perpendicular MRAM (or perpendicular spin-transfer-torque MRAM, i.e., pSTT-MRAM), a write current is proportional to both the damping constant and the energy barrier, and inversely proportional to a spin polarization degree. In general, the higher the write current, the faster the write process will complete. Ideally, a write process time of a few nano-seconds is required for high performance memories. However, a high write current of several hundred µA is typically required to flip that magnetization which is a major challenge for the establishment of pSTT-based storage devices in universal memories. But higher write current may accelerate the wear-out of the MTJ—particularly for perpendicular spin-transfer torque magnetic random-access memory (pSTT-MRAM), where the write current goes through the MTJ. Therefore, it is desired to develop new technologies to greatly enhance write efficiency or perpendicular spin-torque transfer efficiency while keeping a high MR ratio and thermal stability. A modeling study (see Article: *Appl. Phys. Lett.* 99, 132502 (2011), by I. Yulaev, et al.) on spin-transfer-torque magnetization reversal in a composite recording layer comprising a bi-layered exchange-spring structure: a magnetically soft layer/a magnetically hard layer, suggests that a reduction in critical write current may be expected from the increased perpendicular spin-torque transfer efficiency with reversal modes of exchange-spring magnets of the magnetically soft-hard composite structure.

BRIEF SUMMARY OF THE PRESENT INVENTION

The present invention comprises perpendicular magnetoresistive elements and methods of manufacturing such perpendicular magnetoresistive elements for perpendicular spin-transfer-torque MRAM.

The perpendicular magnetoresistive element in the invention is sandwiched between an upper electrode and a lower electrode of each MRAM memory cell, which also comprises a write circuit which bi-directionally supplies a spin polarized current to the magnetoresistive element and a select transistor electrically connected between the magnetoresistive element and the write circuit.

The perpendicular magnetoresistive element comprises: a magnetic reference layer having magnetic anisotropy in a direction perpendicular to a film surface and having an invariable magnetization direction; a tunnel barrier layer provided on the magnetic reference layer; a magnetic recording layer provided on the tunnel barrier layer and having magnetic anisotropy in a direction perpendicular to a film surface and having a variable magnetization direction; a nonmagnetic nano-current channel (NCC) structure provided on the surface of the magnetic recording layer and a cap layer provided on the surface of the NCC structure, wherein the NCC structure comprises a spatial distribution of perpendicular conducting channels throughout the NCC structure thickness and surrounded by an insulating or poorly conductive medium, and channeled regions of the magnetic recording layer which are directly under perpendicular conducting channels have lower interfacial perpendicular magnetic anisotropies (PMAs) than non-channeled regions of the magnetic recording layer which are not directly under perpendicular conducting channels, producing a magnetically soft-hard composite structure, as an exchange-spring magnet matrix, in a single recording layer.

In a special case, the NCC structure is formed by sequentially depositing a first MgO thin film, a non-magnetic metal (NM) thin film and a second MgO thin film, wherein the first MgO thin film is a continuous film having a thickness of no more than 7.5 Angstrom, the non-magnetic metal thin film, preferably being made of Cu, W or a noble metal which has no chemical interaction with MgO films with a large contact angle, has a sufficiently small thickness such that it forms disconnected islands on the first MgO thin film, and the second MgO thin film, having a thickness of no more than 15 Angstrom and being made by either RF deposition of MgO or Mg deposition under O2 exposure (reactive-oxidation), does not grow layer by layer (Frank-Van der Merwe mode) but as 3-D dots or clusters (Volmer-Weber mode). As a result, the NCC structure is formed to comprise a spatial distribution of perpendicular conducting channels, which mainly consist of highly conductive MgO-NM bilayer or MgO-NM-MgO trilayer throughout the NCC thickness, surrounded by an insulating or poorly conductive medium of a thicker MgO layer. The interfacial Fe—O bonds between the insulating medium and its contacting area of the magnetic recording layer (also called non-channeled regions) is stronger than those between perpendicular conducting channels and their contacting areas of the magnetic recording layer (also called channeled regions), correspondingly, non-channeled regions of the magnetic recording layer has a higher PMA than channeled regions.

The perpendicular magnetoresistive element further comprises a bottom electrode and a top electrode. As a write voltage is applied between the bottom electrode and the top electrode, as a result of the NCC structure, the spin-polarized current distribution across the magnetic recording layer between the tunnel barrier layer and the NCC structure is inhomogeneous: the spin-polarized current density in channeled regions of the magnetic recording layer is significantly larger than the spin-polarized current density in non-channeled regions of the magnetic recording layer. Both the higher spin-polarized current density and the lower PMA in channeled regions cause an easy and/or fast magnetic domain reversal in channeled regions which further induces magnetic domain reversal in non-channeled regions due to the exchange coupling between channeled regions and non-channeled regions. Correspondingly, the critical write current and write power are reduced with above advanced reversal modes of exchange-spring magnets of the magnetically soft-hard composite structure. The perpendicular magnetoresistive element may comprise an assisting magnetic layer between the NCC structure and the cap layer for further write power reduction.

DETAILED DESCRIPTION OF THE INVENTION

In general, according to one embodiment, there is provided a magnetoresistive element comprising:
a magnetic reference layer having a perpendicular magnetic anisotropy and having an invariable magnetization direction;
a tunnel barrier layer provided on the magnetic reference layer;

a magnetic recording layer provided on the tunnel barrier layer and having a perpendicular magnetic anisotropy and a variable magnetization direction;

a nonmagnetic nano-current channel (NCC) structure provided on the magnetic recording layer, wherein the NCC structure comprises perpendicular conducting channels dispersed throughout the NCC structure thickness and surrounded by an insulating or poorly conductive medium, and channeled regions of the magnetic recording layer which are directly under perpendicular conducting channels have lower interfacial perpendicular magnetic anisotropies (PMAs) than non-channeled regions of the magnetic recording layer which are not directly under perpendicular conducting channels;

a cap layer provided on the NCC structure; and an upper-contact multilayer provided on the cap layer, comprising a buffer layer and a photoresist layer for further photo-lithographic processes of a magnetoresistive element.

Figure 1:
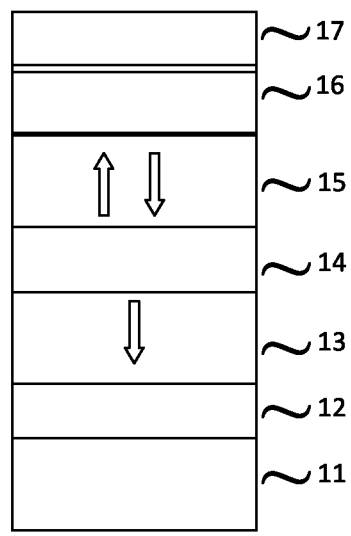
FIG. 1 is a cross-sectional view showing a schematic configuration of an MTJ element 1 as a prior art.

FIG. 1 is a cross-sectional view showing a configuration of an MTJ element 1 as a prior art. The MTJ element 1 is configured by stacking a bottom electrode 11, a seed layer 12, a reference layer 13, a tunnel barrier layer 14, a recording layer 15, a cap layer 16, and a protective layer 17 in this order from the bottom.

Both the reference layer 13 and the recording layer 15 are made of ferromagnetic materials, and have uni-axial magnetic anisotropy in a direction perpendicular to a film surface. Further, both directions of easy magnetizations of the reference layer 13 and the recording layer 15 are also perpendicular to the film surfaces. A direction of easy magnetization is a direction in which the internal magnetic energy is at its minimum where no external magnetic field exists. Meanwhile, a direction of hard magnetization is a direction which the internal energy is at its maximum where no external magnetic field exists. The tunnel barrier layer 14 is made of a non-magnetic insulating metal oxide.

The recording layer 15 has a variable (reversible) magnetization direction, while the reference layer 13 has an invariable (fixing) magnetization direction. The reference layer 13 is made of a ferromagnetic material having a perpendicular magnetic anisotropic energy which is sufficiently greater than the recording layer 15. This strong perpendicular magnetic anisotropy can be achieved by selecting a material, configuration and a film thickness. In this manner, a spin polarized current may only reverse the magnetization direction of the recording layer 15 while the magnetization direction of the reference layer 13 remains unchanged.

The cap layer 16 is a metal oxide layer having at least a thickness of 7 angstroms, which serves to introduce or improve perpendicular magnetic anisotropy of the recording layer 15. As an amorphous ferromagnetic material, like CoFeB, in the recording layer is thermally annealed, a crystallization process occurs to form bcc CoFe grains having epitaxial growth with (100) plane parallel to surface of the tunnel barrier layer and a perpendicular anisotropy is induced in the recording layer, as Boron elements migrate away the cap layer. Typically, the recording layer contains a metal insertion layer in the middle, which serves as a good absorber for the Boron elements in the recording layer to achieve better epitaxial CoFe crystal grains, and consequentially the recoding layer has a lower damping constant than the original CoFeB recording layer.

First Embodiment

Figure 2A:
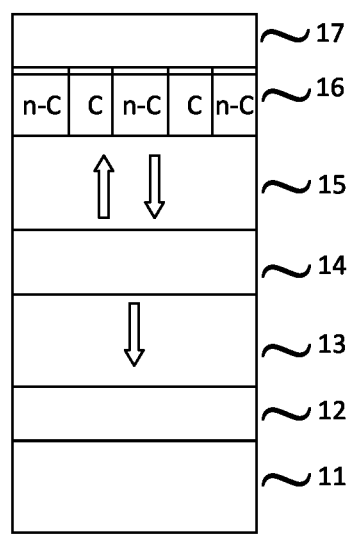
FIG. 2A is a cross-sectional view showing a schematic configuration of an MTJ element 10 of this invention.
Figure 2B:
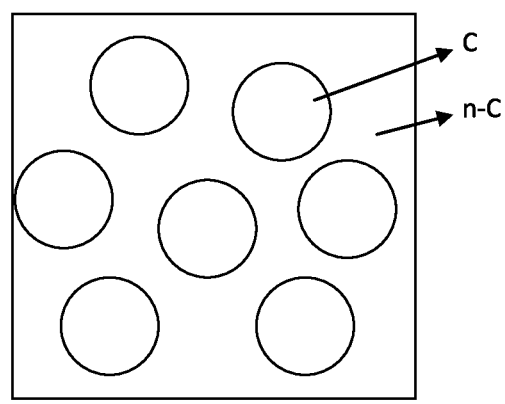
FIG. 2B is a schematic top view diagram of one NCC layer region in an MTJ element of this invention.

FIG. 2A is a cross-sectional view showing a schematic configuration of an MTJ element 10 as deposited according to the first embodiment of this invention. The MTJ element 10 is configured by stacking a bottom electrode 11, a seed layer 12, a magnetic reference layer 13, a tunnel barrier layer 14, a magnetic recording layer 15, a nonmagnetic nano-current channel (NCC) structure 16 and a cap layer 17 in this order from the bottom. FIG. 2B is a schematic top view diagram of a region of the NCC structure 16.

Being similar to the prior art, the magnetic reference layer 13 and the magnetic recording layer 15 are made of ferromagnetic materials, and have uni-axial magnetic anisotropy in a direction perpendicular to a film surface. Directions of easy magnetizations of the magnetic reference layer 13 and the magnetic recording layer 15 are also perpendicular to the film surfaces. In another word, the MTJ element 10 is a perpendicular MTJ element in which magnetization directions of the magnetic reference layer 13 and the magnetic recording layer 15 face in directions perpendicular to the film surfaces. Also the tunnel barrier layer 14 is made of a non-magnetic insulating metal oxide.

The magnetic recording layer 15 has a variable (reversible) magnetization direction, while the magnetic reference layer 13 has an invariable (fixing) magnetization direction. The magnetic reference layer 13 is made of a ferromagnetic material having a perpendicular magnetic anisotropic energy which is sufficiently greater than the magnetic recording layer 15. This strong perpendicular magnetic anisotropy can be achieved by selecting a material, configuration and a film thickness. In this manner, a spin polarized current may only reverse the magnetization direction of the magnetic recording layer 15 while the magnetization direction of the reference layer 13 remains unchanged.

The NCC structure 16 comprises a spatial distribution of perpendicular conducting channels (as shown by striped patterns of the NCC structure 16 in FIG. 2A and FIG. 2B) of cylindrical or oval prism or other prism shapes throughout the NCC structure thickness and surrounded by an insulating or poorly conductive medium (as shown by dotted patterns of the NCC structure 16 in FIG. 2A and FIG. 2B). The magnetic recording layer has two types of regions: channeled regions which are perpendicularly aligned with the perpendicular conducting channels of the NCC structure, and non-channeled regions which are perpendicularly aligned with the insulating medium of the NCC structure. In another word, each channeled region of the magnetic recording layer directly contacts a surface of one of the perpendicular conducting channels of the NCC structure, while non-channeled regions directly contact a surface of the insulating medium. Because of different contacting or interface materials/structures between the magnetic recording layer and the NCC structure, the channeled regions of the magnetic recording layer which are directly under perpendicular conducting channels have lower interfacial perpendicular magnetic anisotropies (PMAs) than non-channeled regions of the magnetic recording layer which are not directly under perpendicular conducting channels.

In the NCC structure 16, as shown in FIG. 2A and FIG. 2B, "C" represents perpendicular conducting channel which is highly conductive, while "n-C" represents insulating medium which is poorly conductive. Each perpendicular conducting channel comprises a nonmagnetic metal island and may comprise an ultra-thin metal oxide, or nitride layer, having a thickness of no more than 7.5 angstroms, which has a very low resistance-area product (RA) compared to the resistance-area product (RA) of the tunnel barrier layer 14. The total planar area of perpendicular conducting channels is at least one third of the total planar area of the NCC structure. The surrounding insulating medium comprises a thick metal oxide or a nitride layer, which has a very high resistance-area product (RA) compared to the resistance-area product (RA) of the tunnel barrier layer 14. Note that the resistance of a metal oxide, such as MgO, is typically an exponential function of its thickness, i.e., the resistance increases extremely fast with its thickness.

The perpendicular magnetoresistive element 10 further comprises a bottom electrode and a top electrode (not shown here). As a write voltage is applied between the bottom electrode and the top electrode, as a result of above NCC structure, an inhomogeneous current distribution across the magnetic recording layer between the tunnel barrier layer and the NCC structure exists: the electric or spin-polarized current density in channeled regions of the magnetic recording layer is significantly larger than the electric or spin-polarized current density in non-channeled regions of the magnetic recording layer. Since channeled regions have lower interfacial perpendicular magnetic anisotropies (PMAs) than non-channeled regions, channeled regions behave like soft magnets while non-channeled regions behave like hard magnets. So equivalently the magnetic recording layer is a composite magnetic layer comprising soft magnets and hard magnets which are coupled together through ferromagnetic exchange coupling. In another word, it is a magnetically soft-hard composite structure, or a single-layered exchange-spring structure, in which each soft magnet is ferromagnetically exchange coupled to its adjacent hard magnets, and vice versa. In a typical MRAM device, the thermal stability requirement is $E_b>60 k_B T$. Here, $E_b$ is the energy barrier for magnetization reversal of the magnetic recording layer, $k_B$ is the Boltzmann constant and T is the absolute temperature of the device. With a proper exchange coupling, $E_b$ of a composite magnetic layer comprising soft magnets and hard magnets is expected to be similar to that of a magnetic layer consisting of all hard magnets. For pSTT-current driven switch, it is expected to have smaller write current amplitudes and shorter pulse durations required to reverse the magnetization compared to a homogeneous magnetic recording layer of comparable thermal stability. Both the higher spin-polarized current density and the lower PMA in channeled regions cause fast magnetic domain reversals in channeled regions which further induce magnetic domain reversals in non-channeled regions due to the exchange coupling between channeled regions and non-channeled regions. Correspondingly, the critical write current and write power are reduced from the greatly increased STT efficiency acting on the soft magnets (i.e., channeled regions of the recording layer) combined with reversal modes of exchange-spring magnet matrix.

An example configuration of the MTJ element 10 will be described below. The magnetic reference layer 13 is made of Pt (around 5 nm)/[Co/Pt]$_3$/Co (around 0.5 nm)/Ru (around 0.5 nm)/Co (around 0.5 nm)/W (around 0.2 nm)/CoFeB (around 1 nm). The tunnel barrier layer 14 is made of MgO (around 1 nm). The magnetic recording layer 15 is made of CoFeB (around 1.5 nm)/W (0.3 nm)/CoFeB (around 0.6 nm). The cap layer 17 is made of Ru/Ta (around 10 nm). The seed layer 12 is made of Ta (around 20 nm)/Ru (around 20 nm)/Ta (around 20 nm). The detailed configuration of NCC structure 16 and its forming methods are illustrated in FIGS. 3A, 3B, 4A and 4B as follows. Here, and thereafter throughout this application, each element written in the left side of "I" is stacked below an element written in the right side thereof.

Figure 3A:
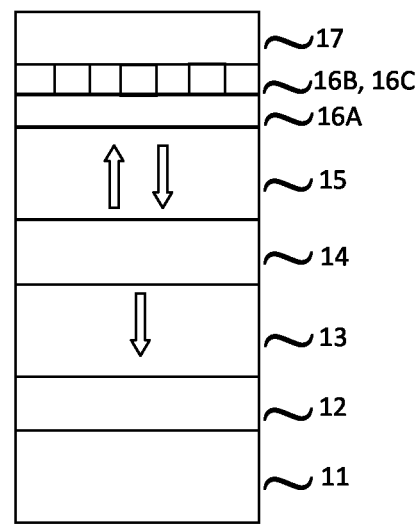
FIG. 3A is a cross-sectional view showing a schematic configuration of an MTJ element 30 having a first NCC structure, according to the first embodiment.

FIG. 3A is a cross-sectional view showing the configuration of the first NCC structure example in the MTJ element 30. The MTJ element 30 is configured by stacking a bottom electrode 11, a seed layer 12, a magnetic reference layer 13, a tunnel barrier layer 14, a magnetic recording layer 15, a NCC structure comprising a first thin metal oxide layer 16A which is continuous, a thin metal layer 16B (striped pattern) which is discontinuous as metal islands and a second thin metal oxide layer 16C (dotted pattern) which is discontinuous as oxide islands, and a cap layer 17 in this order from the bottom. The metal oxide layer 16A and oxide islands 16C are preferred to be MgO or other stable metal oxide having no chemical interaction with the material of the metal islands 16B, which is preferred to be Cu, W or noble elements such as Pt, Au, Ag, Ru, Rh, Pd, Ir, etc. These transition metals may be oxidized or partially oxidized, but they are still highly conductive.

Figure 4A:
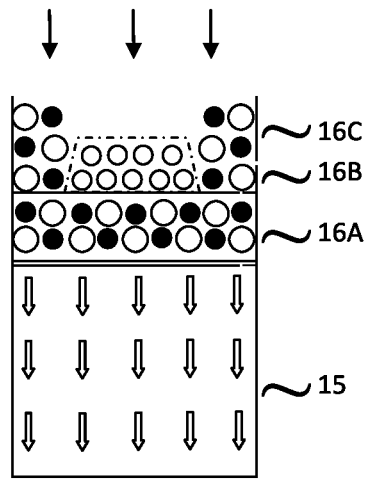
FIG. 4A is a cross-sectional view showing a schematic diagram of the deposition processing of the second MgO thin film in the first NCC structure 40, according to the first embodiment.

The above NCC structure is formed by sequential steps comprising of: forming of the thin metal oxide layer (the first MgO film) 16A on top surface of the recording layer 15, forming of metal islands (Cu) 16B on the thin metal oxide layer 16A, and forming of the oxide islands (the second MgO film) 16C on the thin metal oxide layer 16A, as shown by the schematic diagram in FIG. 4A, where solid black circles represent Mg atoms, open circles represent 0 atoms and stripped circles represent Cu atoms. More specifically, the formation of metal islands 16B comprises a deposition of Cu, which has no chemical interaction with the first MgO film 16A, a large contact angle more than 130-degree and a sufficiently small thickness such that it forms disconnected islands 16B on the first MgO thin film 16A. The formation of oxide islands (the second MgO film) 16C comprises either RF deposition of MgO or Mg deposition under 02 exposure (reactive-oxidation) and optionally post-annealed. By this method, the second MgO film does not grow layer by layer (Frank-Van der Merwe mode) but as 3-D dots or clusters (Volmer-Weber mode). During deposition, since incoming Mg atoms prefer the first MgO thin film surface to the Cu island surface, most of them move onto the first MgO thin film surface 16A and be oxidized, forming 3-D MgO islands 16C only on the first MgO thin film 16A, as the second MgO film is sufficiently thin. As a result, the NCC structure is formed to comprise a spatial distribution of perpendicular conducting channels, which mainly consist of highly conductive $1^{st}$-MgO-thin-film/NM or $1^{st}$-MgO-thin-film/NM/part-of-$2^{nd}$-MgO-thin-film, being surrounded by an insulating medium of $1^{st}$-MgO-thin-film/$2^{nd}$-MgO-thin-film. Therefore, this structure gives rise to perpendicular conductive channels through metal islands 16B, while the surrounding insulating medium, which is a much thicker MgO film, becomes poorly conductive due to the fact that the resistance of an MgO film is exponentially increasing with its thickness. The interfacial Fe—O bonds between the insulating medium and its contacting area of the magnetic recording layer (also called non-channeled regions) is stronger than those between perpendicular conducting channels and their contacting area of the magnetic recording layer (also called channeled regions), correspondingly, non-channeled regions of the magnetic recording layer has a higher PMA than channeled regions. Preferably, the thickness of the first MgO thin film is adjusted to be sufficiently thin in order to make channeled regions of the magnetic recording layer have a much lower PMA than non-channeled regions which has a thicker MgO film on the top surface. In another word, the channeled regions of the magnetic recording layer are magnetically soft while the non-channeled regions of the magnetic recording layer are magnetically hard, and they are exchange-coupled.

Figure 3B:
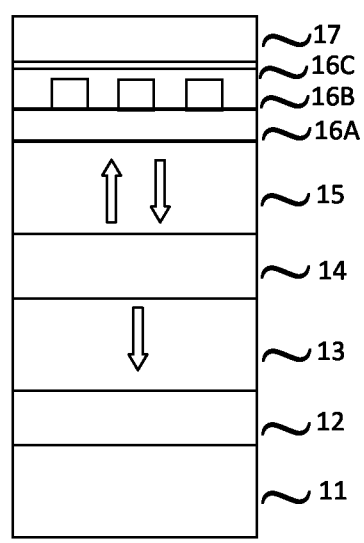
FIG. 3B is a cross-sectional view showing a schematic configuration of an MTJ element 31 having a second NCC structure, according to the first embodiment.

FIG. 3B is a cross-sectional view showing the configuration of the second NCC structure example in the MTJ element 31. The MTJ element 31 is configured by stacking a bottom electrode 11, a seed layer 12, a reference layer 13, a tunnel barrier layer 14, a recording layer 15, a NCC structure comprising a first thin metal oxide layer 16A, a thin metal layer 16B (striped pattern) which is discontinuous as metal islands and a second thin metal oxide layer 16C which (dotted pattern) is continuous, and a cap layer 17 in this order from the bottom. The second NCC structure example is similar to the first NCC structure example except that the second thin metal oxide layer 16C is thicker so that it completely covers the thin metal layer 16B. The metal oxide layer 16A and the oxide layer 16C are preferred to be MgO or other stable metal oxide having no chemical interaction with the material of the metal islands 16B, which is preferred to be Cu, W or noble elements such as Pt, Au, Ag, Ru, Rh, Pd, Ir, etc.

Figure 4B:
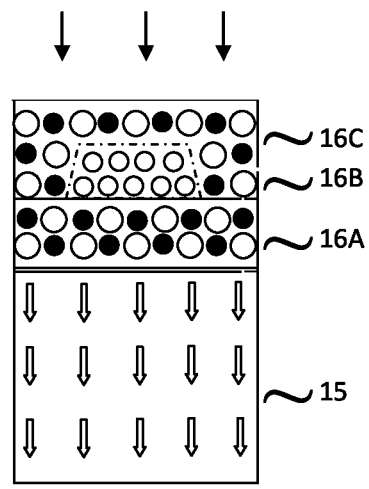
FIG. 4B is a cross-sectional view showing a schematic diagram of the deposition processing of the second MgO thin film in the second NCC structure 41, according to the first embodiment.

The NCC structure as shown in FIG. 3B can be formed by sequential steps comprising of: forming of the thin metal oxide layer (the first MgO film) 16A on top surface of the recording layer 15, forming of metal islands (Cu) 16B on the thin metal oxide layer 16A, and forming of the oxide layer (the second MgO film) 16C on the thin metal oxide layer 16A and metal islands 16B, as shown by the schematic diagram in FIG. 4B, where solid black circles represent Mg atoms, open circles represent 0 atoms and stripped circles represent Cu atoms. More specifically, the formation of metal islands 16B comprises a deposition of Cu, which has no chemical interaction with the first MgO film 16A, a large contact angle more than 130-degree and a sufficiently small thickness such that it forms disconnected islands 16B on the first MgO thin film 16A. A heated substrate may further help facilitate these disconnected islands 16B. The formation of oxide layer (the second MgO) 16C comprises either RF deposition of MgO or Mg deposition under O2 exposure (reactive-oxidation) and optionally post-annealed. By this method, the second MgO film does not grow layer by layer (Frank-Van der Merwe mode) but as 3-D dots or clusters (Volmer-Weber mode). During deposition, since incoming Mg atoms prefer the first MgO thin film surface to the Cu island surface, most of them move onto the first MgO thin film surface 16A and be oxidized, forming an MgO layer 16C on the first MgO thin film 16A and metal islands 16B. The MgO layer 16C has a larger thickness on the first MgO thin film 16A than on metal islands 16B, producing perpendicular conductive channels through metal islands 16B.

Second Embodiment

Figure 5:
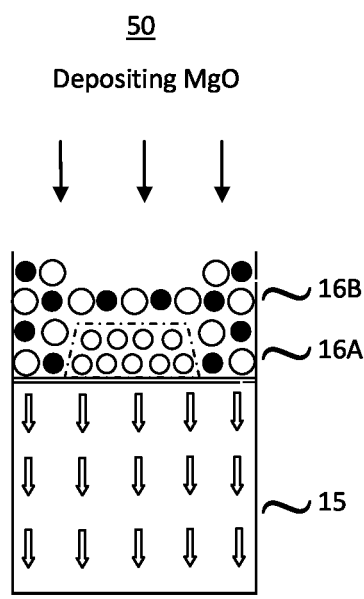
FIG. 5 is a cross-sectional view showing a schematic diagram of the deposition processing of an alternative NCC structure 50, according to the second embodiment.

FIG. 5 is a cross-sectional view showing a deposition processing of an alternative NCC structure 50, according to the second embodiment of this invention. Unlike the first embodiment, this alternative NCC structure does not have a first metal oxide layer. Instead, this NCC structure comprises a thin metal layer 16A which is discontinuous as metal islands and a thin metal oxide layer 16B which is either continuous or discontinuous.

It is well-known that the island-growth behavior is very likely to take place for all noble metals and many non-noble transition metals when deposited on oxides. When the deposited film thickness is thin enough, noble metals and some of non-noble transition metal may still form discrete islands or nano-particles on a different metal or metal alloy surface during deposition on a heated substrate. After the discontinuous metal layer 16A is formed on the magnetic recording layer 15, the thin metal oxide layer 16B is deposited, as shown in FIG. 5, producing perpendicular conductive channels through metal islands 16A. The thin oxide layer 16B is preferred to be MgO, and other stable oxide materials. The non-channeled regions of the magnetic recording layer which are directly contacting with the oxide layer 16B have a higher interfacial PMA than The channeled regions of the magnetic recording layer 15 underneath metal islands 16A, due to the interfacial Fe—O bonds at the interface between the magnetic recording layer 15 and the 16B.

Third Embodiment

Figure 6:
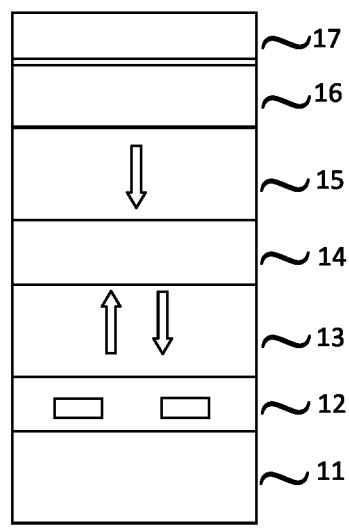
FIG. 6 is a cross-sectional view showing a configuration of an MTJ element 60 as deposited, according to the third embodiment.

FIG. 6 is a cross-sectional view showing a configuration of an MTJ element 60 as deposited according to the third embodiment. The MTJ element 60 is configured by stacking a bottom electrode 11, a NCC structure 12, a magnetic recording layer 13, a tunnel barrier layer 14, a magnetic reference layer 15, a synthetic antiferromagnetic stack 16 and a cap layer 17 in this order from the bottom.

Similar to the first and the second embodiments, the NCC structure 12 comprises perpendicular conducting channels dispersed throughout the NCC structure thickness and surrounded an insulating or poorly conductive medium, and channeled regions of the magnetic recording layer 13 which are directly above perpendicular conducting channels have lower interfacial perpendicular magnetic anisotropies (PMAs) than non-channeled regions of the magnetic recording layer which are not directly above perpendicular conducting channels. Since the NCC structure 12 is underneath the magnetic recording layer 13, it is easily to form a desired NCC structure. For example, a thin oxide sub-layer is formed, followed by forming a thin metal layer which is discontinuous islands, optionally another thin oxide sub-layer is formed over the thin metal layer, since the island-growth behavior is very likely to take place for all noble metals and many non-noble transition metals when deposited on oxides.

Fourth Embodiment

Figure 7:
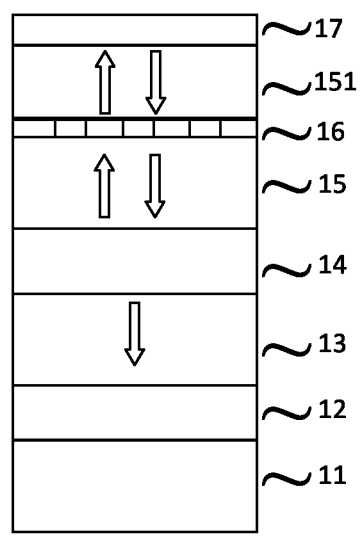
FIG. 7 is a cross-sectional view showing a configuration of an MTJ element 70 as deposited, according to the fourth embodiment.

Similar to above embodiments, the same principle can be adopted in a NCC structure inserted in the middle of the magnetic recording layer. As shown in FIG. 7, the MTJ element 70, as the fourth embodiment of this invention, is configured by stacking a bottom electrode 11, a seed layer 12, a reference layer 13, a tunnel barrier layer 14, a first magnetic recording sub-layer 15, a NCC structure 16, a second magnetic recording sub-layer 151 and a cap layer 17 in this order from the bottom.

In this embodiment, the NCC structure is sufficiently thin so that the first magnetic recording sub-layer 15 and the second magnetic recording sub-layer 151 are magnetic coupled across the NCC structure. For example, in one set of perpendicular-MTJ samples, the NCC structure is formed by sequentially depositing MgO (4 Angstroms)/Cu (1 Angstrom)/MgO (4 Angstroms). The experimental data show that the sample without a NCC structure has an MR ratio ~179% and a Resistance-Area product (RA)~5.6 ohms·micron$^2$, while the sample with the NCC structure has about the same MR ratio ~180% and a Resistance-Area product (RA)~10 ohms·micron$^2$. The higher RA is due to the fact that the NCC structure limits the electric current path. More data analysis suggests that the total area of the channeled regions can be controlled to be about 50% of the total area of the MTJ device, while the first magnetic sub-layer 15 and the second magnetic sub-layer still have a strong ferromagnetic exchange coupling.

All of above embodiments may further comprise an assisting magnetic layer provided in proximity of the magnetic recording layer, especially between the NCC structure and the cap layer. The assisting magnetic layer has a magnetization direction either in the film plane or perpendicular to the film surface, and may provide an additional spin-transfer-torque on the magnetic recording layer, or may provide a shielding effect to reduce stray damage field from the magnetic recording layer during the switching process. The assisting magnetic layer may comprise at least one of an iron (Fe) layer, a cobalt (Co) layer, an alloy layer of cobalt iron (CoFe), an alloy layer of iron boron (FeB), an alloy layer of cobalt boron (CoB), an alloy layer of cobalt iron boron (CoFeB), an alloy layer of cobalt nickel iron (CoNiFe), an alloy layer of cobalt nickel (CoNi), an alloy layer of iron platinum (FePt), an alloy layer of iron palladium (FePd), an alloy layer of iron nickel (FeNi), a laminated layer of $(Fe/Co)_n$, a laminated layer of $(Fe/CoFe)_n$, a laminated layer of $(Fe/Pt)_n$, a laminated layer of $(Fe/Pd)_n$ and a laminated layer of $(Fe/Ni)_n$, where n is a lamination number being at least 3, and the B composition percentage is no more than 35%. The assisting magnetic layer may be a multilayer of ferromagnetic materials.

While certain embodiments have been described above, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

The invention claimed is:

1. A magnetoresistive element comprising:
a magnetic reference layer having a reference layer magnetization fixed in a direction perpendicular to the magnetic reference layer;
a tunnel barrier layer provided on a surface of the reference layer;
a magnetic recording layer provided on a surface of the tunnel barrier layer, which is opposite to a surface of the tunnel barrier layer where the magnetic reference layer is provided, and having a recording layer magnetization that is perpendicular to the magnetic recording layer and is changeable relative to the reference layer magnetization;
a nonmagnetic nano-current-channel (NCC) structure provided on a surface of the magnetic recording layer, which is opposite to a surface of the magnetic recording layer where the tunnel barrier layer is provided, and comprising a spatial distribution of perpendicular conducting channels throughout the NCC structure thickness and surrounded by an insulating medium; and
a cap layer provided on a surface of the NCC structure, which is opposite to a surface of the NCC structure where the magnetic recording layer is provided;
wherein said tunnel barrier layer has a first resistance-area product ($RA_1$), each of said perpendicular conducting channels is electrically conductive in a perpendicular direction between said magnetic recording layer and said cap layer and has a second resistance-area product ($RA_2$), said insulating medium comprises at least one oxide layer and is less electrically conductive in a perpendicular direction between said magnetic recording layer and said cap layer than each of said perpendicular conducting channels and has a third resistance-area product ($RA_3$), and said magnetic recording layer has channeled regions which directly contact said perpendicular conducting channels of said NCC structure, and non-channeled regions which directly contact said insulating medium of said NCC structure, wherein each of said channeled regions of said magnetic recording layer has a lower perpendicular magnetic anisotropy (PMA) than said non-channeled regions of said magnetic recording layer.

2. The element of claim 1, wherein said second resistance-area product ($RA_2$) is no more than 15% of said first resistance-area product ($RA_1$), and said third resistance-area product ($RA_3$) is at least 25% of said first resistance-area product ($RA_1$).

3. The element of claim 1, wherein said third resistance-area product ($RA_3$) is at least 5 times said first resistance-area product ($RA_1$).

4. The element of claim 1, wherein the total area of said channeled regions of said magnetic recording layer is at least one third of the total area of said magnetic recording layer.

5. The element of claim 1, wherein each of said perpendicular conducting channels comprises at least one layer of transition metal or conductive transition metal oxide, the transition metal or conductive transition metal oxide selected from the group consisting of Cu, Mo, W, Pt, Ru, Au, Ag, Ru, Rh, Ir, Os, Re, alloys thereof, and oxides thereof.

6. The element of claim 5, wherein each of said perpendicular conducting channels further comprises at least one layer of oxide or nitride, the oxide or nitride selected from the group consisting of $Al_2O_3$, $HfO_2$, $ZrO_2$, $TiO_2$, $SiO_2$, $Y_2O_3$, RuO, OsO, TcO, ReO, CoO, NiO, BeO, SiN, RuN, OsN, TcN, and ReN.

7. The element of claim 5, wherein each of said perpendicular conducting channels further comprises at least one layer of rocksalt crystalline metal oxide, the rocksalt crystalline metal oxide selected from the group consisting of NiO, CoO, FeO, $FeCoO_2$, $NiFeO_2$, $CoNiO_2$, MnO, CrO, VO, TiO, MgO, $MgAl_2O_4$, MgZnO, ZnO and CdO.

8. The element of claim 5, wherein each of said perpendicular conducting channels further comprises a first layer of metal oxide or metal nitride, and a second layer of metal oxide or metal nitride, that sandwich at least one layer of said transition metal or said conductive transition metal oxide.

9. The element of claim 1, wherein said insulating medium comprises at least one layer of oxide or nitride, the oxide or nitride selected from the group consisting of $Al_2O_3$, $HfO_2$, $ZrO_2$, $TiO_2$, $SiO_2$, $Y_2O_3$, RuO, OsO, TcO, ReO, CoO, NiO, BeO, SiN, RuN, OsN, TcN, and ReN.

10. The element of claim 1, wherein said insulating medium comprises at least one layer of rocksalt crystalline metal oxide, the rocksalt crystalline metal oxide selected from the group consisting of NiO, CoO, FeO, $FeCoO_2$, $NiFeO_2$, $CoNiO_2$, MnO, CrO, VO, TiO, MgO, $MgAl_2O_4$, MgZnO, ZnO and CdO.

11. The element of claim 1, wherein said magnetic recording layer comprises at least one ferromagnetic layer, the ferromagnetic layer selected from the group consisting of CoFe, Fe, Co, CoFeB, CoB and FeB.

12. The element of claim 1, further comprising an assisting magnetic layer between said NCC structure and said cap layer, the assisting magnetic layer selected from the group consisting of an iron (Fe) layer, a cobalt (Co) layer, an alloy layer of cobalt iron (CoFe), an alloy layer of iron boron (FeB), an alloy layer of cobalt boron (CoB), an alloy layer of cobalt iron boron (CoFeB), an alloy layer of cobalt nickel iron (CoNiFe), an alloy layer of cobalt nickel (CoNi), an alloy layer of iron platinum (FePt), an alloy layer of iron palladium (FePd), an alloy layer of iron nickel (FeNi), a laminated layer of (Fe/Co)$_n$, a laminated layer of (Fe/CoFe)$_n$, a laminated layer of (Fe/Pt)$_n$, a laminated layer of (Fe/Pd)$_n$ and a laminated layer of (Fe/Ni)$_n$, wherein n is a lamination number.

13. The element of claim 12, wherein said assisting magnetic layer and said magnetic recording layer have a ferromagnetic exchange coupling across said NCC structure.

14. The element of claim 12, wherein said assisting magnetic layer has a magnetization direction either in the film plane or perpendicular to the film surface.

15. The element of claim 1, wherein said NCC structure has a thickness of no more than 20 angstroms.

16. The element of claim 1, further comprising an upper electrode and a lower electrode which sandwich said magnetoresistive element, and further comprising a write circuit which bi-directionally supplies a current to said magnetoresistive element, and a select transistor electrically connected between said magnetoresistive element and said write circuit.

17. The element of claim 1, wherein each of said channeled regions of said magnetic recording layer is magnetically soft and said non-channeled regions of said magnetic recording layer are magnetically hard, and the energy barrier for magnetization reversal of said magnetic recording layer is more than 60 k$_B$T, where k$_B$ is the Boltzmann constant and T is the absolute temperature of the element.

18. The element of claim 1, wherein said NCC structure comprises a first metal oxide layer provided on a surface of said magnetic recording layer, which is opposite to a surface of said magnetic recording layer where said tunnel barrier layer is provided; a second metal oxide layer; and a discontinuous metal layer between said first metal oxide layer and said second metal oxide layer, wherein said first metal oxide layer is continuous and has a thickness of no more than 7.5 angstroms, said discontinuous metal layer is discontinuous and comprises at least one transition metal element selected from the group consisting of Cu, W, Pt, Au, Ag, Ru, Rh, Ir, Os and Re, at least one of said first metal oxide layer and said second metal oxide layer comprises one layer of rocksalt crystalline metal oxide, the rocksalt crystalline metal oxide selected from the group consisting of NiO, CoO, FeO, FeCoO$_2$, NiFeO$_2$, CoNiO$_2$, MnO, CrO, VO, TiO, MgO, MgAl$_2$O$_4$, MgZnO, ZnO and CdO, wherein said first metal oxide layer, said discontinuous metal layer and said second metal oxide layer form said spatial distribution of perpendicular conducting channels surrounded by said insulating medium.

19. The element of claim 1, wherein said NCC structure comprises a discontinuous metal layer provided on a surface of said magnetic recording layer, which is opposite to a surface of said magnetic recording layer where said tunnel barrier layer is provided; and a thin metal oxide layer provided on a surface of said discontinuous metal layer, which is opposite to a surface of said discontinuous metal layer where said magnetic recording layer is provided, wherein said discontinuous metal layer is discontinuous and comprises at least one transition metal element selected from the group consisting of Mo, W, Pt, Au, Ag, Ru, Rh, Ir, Os and Re, said thin metal oxide layer comprises at least one layer of rocksalt crystalline metal oxide, the rocksalt crystalline metal oxide selected from the group consisting of NiO, CoO, FeO, FeCoO$_2$, NiFeO$_2$, CoNiO$_2$, MnO, CrO, VO, TiO, MgO, MgAl$_2$O$_4$, MgZnO, ZnO and CdO, and having a thickness between 5 angstroms and 20 angstroms, wherein said discontinuous metal layer and said thin metal oxide layer form said spatial distribution of perpendicular conducting channels throughout said NCC structure thickness and surrounded by said insulating medium.

* * * * *